United States Patent
Fitzgerald

(10) Patent No.: US 6,900,103 B2
(45) Date of Patent: May 31, 2005

(54) RELAXED SILICON GERMANIUM PLATFORM FOR HIGH SPEED CMOS ELECTRONICS AND HIGH SPEED ANALOG CIRCUITS

(75) Inventor: Eugene A. Fitzgerald, Windham, NH (US)

(73) Assignee: Amberwave Systems Corporation, Salem, NH (US)

( * ) Notice: Subject to any disclaimer, the term of this patent is extended or adjusted under 35 U.S.C. 154(b) by 88 days.

(21) Appl. No.: 09/906,533

(22) Filed: Jul. 16, 2001

(65) Prior Publication Data

US 2002/0123183 A1 Sep. 5, 2002

Related U.S. Application Data

(60) Provisional application No. 60/273,112, filed on Mar. 2, 2001.

(51) Int. Cl.[7] ............................................. H01L 21/336
(52) U.S. Cl. ..................... 438/285; 438/199; 438/590
(58) Field of Search .......................... 257/19, 192, 194, 257/351, 616, 20; 438/285, 590, 199, 197, 153, 752

(56) References Cited

U.S. PATENT DOCUMENTS

| | | | |
|---|---|---|---|
| 5,155,571 A | * 10/1992 | Wang et al. .................. 257/19 |
| 5,426,069 A | 6/1995 | Selvakumar et al. ......... 437/131 |
| 5,442,205 A | 8/1995 | Brasen et al. ................ 257/191 |
| 5,461,243 A | 10/1995 | Ek et al. ...................... 257/190 |
| 5,523,592 A | 6/1996 | Nakagawa et al. ........... 257/96 |
| 5,534,713 A | 7/1996 | Ismail et al. .................. 257/24 |
| 5,683,934 A | 11/1997 | Candelaria ................... 437/134 |
| 5,759,898 A | 6/1998 | Ek et al. ...................... 438/291 |
| 5,792,679 A | 8/1998 | Nakato ........................ 438/162 |
| 5,891,769 A | 4/1999 | Liaw et al. ................... 438/167 |
| 5,906,951 A | 5/1999 | Chu et al. .................... 438/751 |
| 5,998,807 A | 12/1999 | Lustig et al. ................. 257/66 |
| 6,059,895 A | 5/2000 | Chu et al. .................... 148/33.1 |
| 6,096,590 A | 8/2000 | Chan et al. .................. 438/233 |
| 6,107,653 A | 8/2000 | Fitzgerald .................... 257/191 |
| 6,117,750 A | 9/2000 | Bensahel et al. ............ 438/478 |
| 6,207,977 B1 | 3/2001 | Augusto ...................... 257/192 |
| 6,242,324 B1 | 6/2001 | Kub et al. .................... 438/455 |
| 6,251,755 B1 | 6/2001 | Furukawa et al. ............ 88/510 |
| 6,323,108 B1 | 11/2001 | Kub et al. .................... 438/458 |

(Continued)

FOREIGN PATENT DOCUMENTS

| | | | |
|---|---|---|---|
| EP | 0 683 522 A2 | 11/1995 | ................... 27/92 |
| EP | 1 020 900 A2 | 7/2000 | ................... 21/20 |
| GB | 2 342 777 | 4/2000 | ................... 27/88 |
| JP | 2000031491 | 1/2000 | ................. 29/786 |
| JP | 201319935 | 5/2000 | |

(Continued)

OTHER PUBLICATIONS

Wolf, Stanley, Silicon Processing for the VLSI Era, V. 2: Process Integration, Lattice Press, Sunset Beach, CA, p. 202.*

(Continued)

Primary Examiner—George Fourson
Assistant Examiner—Fernando L. Toledo
(74) Attorney, Agent, or Firm—Goodwin Procter, LLP

(57) ABSTRACT

Structures and methods for fabricating high speed digital, analog, and combined digital/analog systems using planarized relaxed SiGe as the materials platform. The relaxed SiGe allows for a plethora of strained Si layers that possess enhanced electronic properties. By allowing the MOSFET channel to be either at the surface or buried, one can create high-speed digital and/or analog circuits. The planarization before the device epitaxial layers are deposited ensures a flat surface for state-of-the-art lithography.

19 Claims, 17 Drawing Sheets

U.S. PATENT DOCUMENTS

| | | | |
|---|---|---|---|
| 6,350,993 B1 | 2/2002 | Chu et al. | 257/19 |
| 6,399,970 B2 * | 6/2002 | Kubo et al. | 257/194 |
| 2002/0068393 A1 * | 6/2002 | Fitzgerald et al. | |
| 2002/0125471 A1 * | 9/2002 | Fizgerlad et al. | |
| 2002/0140031 A1 | 10/2002 | Rim | 257/347 |

FOREIGN PATENT DOCUMENTS

| | | | |
|---|---|---|---|
| WO | 98/59365 | 12/1998 | 21/20 |
| WO | 99/53539 | 10/1999 | 21/306 |
| WO | 00/54338 | 9/2000 | 29/778 |
| WO | 01/54202 | 7/2001 | 29/10 |
| WO | 01/93338 A1 | 12/2001 | 29/778 |
| WO | 01/99169 A2 | 12/2001 | 21/306 |
| WO | 02/13262 A2 | 2/2002 | 23/0 |
| WO | 02/27783 A1 | 4/2002 | 21/762 |

OTHER PUBLICATIONS

Armstrong, "Technology for SiGe Heterostructure–Based CMOS Devices," Ph.D. Thesis, Massachusetts Institute of Technology, Department of Electrical Engineering and Computer Science (Jun. 30, 1999).

Augusto et al., "Proposal for a New Process Flow for the Fabrication of Silicon–based Compelmentary MOD–MOSFETs without ion Implantation," *Thin Solid Films*, vol. 294, No. 1–2, pp. 254–258 (Feb. 15, 1997).

Hackbarth et al, "Alternatives to Thick MBE–Grown Relaxed SiGe Buffers," *Thin Solid Films*, vol. 369, pp. 148–151 (2000).

Herzog et al., "SiGe–based FETs: Buffer Issues and Device Results," *Thin Solid Films*, vol. 380, No. 1–2, pp. 36–41 (Dec. 12, 2000).

Ismail et al., "Modulation–doped n–type Si/SiGe with Inverted Interface," *Applied Physics Letters*, 65 (10), pp. 1248–1250 (Sep. 5, 1994).

Konig et al., "Design Rules for N–Type SiGe Hetero FETs," *Solid State Electronics*, vol. 41, No. 10, pp. 1541–1547 (Oct. 1, 1997).

Kuznetsov et al., "Technology for high–performance n–channel SiGe modulation–doped field–effect transistors," *J. Vac. Sci. Technol.*, B 13(6), pp. 2892–2896 (Nov./Dec. 1995).

Maiti et al., "Strained–Si Heterostructure Field Effect Transistors," *Semicond. Sci. Technol.*, vol. 13, pp. 1225–1246 (1998).

O'Neill et al., "SiGe Virtual Substrate N–Channel Heterojunction MOSFETs, " *Semicond. Sci. Technol.*, vol. 14, pp. 784–789 (1999).

Parker et al., "SiGe Heterostructure CMOS Circuits and Applications", *Solid–State Electronics*, vol. 43, pp. 1497–1506 (1996).

Rim and Hoyt, "Fabrication and Analysis of Deep Submicron Strained–Si N–MOSFET's", *IEEE Transactions on Electron Devices*, vol. 47, No. 7, pp. 1406–1415 (Jul. 2000).

Welser et al., "Evidence of Real–Space Hot–Electron Transfer in High Mobility, Strained–Si Multilayer MOSFETs," *IEDM*, pp. 545–548 (1993).

Welser et al., "NMOS and PMOS Transistors Fabricated in Strained Silicon/Relaxed Silicon–Germanium Structures," *IEEE*, pp. 1000–1002 (1992).

Wolf and Tauber, *Silicon Processing for the VLSI Era vol. 1: Process Technology*, Lattice Press, Sunset Beach, CA, pp. 384–386 (1986).

Sadek et al., "Design of Si/SiGe Heterojunction Complementary Metal–Oxide–Semiconductor Transistors," IEEE Trans. Electron Devices, Aug. 1996, pp. 1224–1232.

Usami et al., "Spectroscopic study of Si–based quantum wells with neighboring confinement structure," Semicon. Sci. Technol., 1997 (abstract).

Barradas et al., "RBS analysis of MBE–grown SiGe/(001) Si heterostructures with thin, high Ge content SiGe channels for HMOS transistors," Modern Physics Letters B, 2001 (abstract).

Canaperi et al., "Preparation of a relaxed Si–Ge layer on an insulator in fabricating high–speed semiconductor devices with strained epitaxial films," Intern. Business Machines Corporation, USA, 2002 (abstract).

Welser, "The application of strained–silicon/relaxed–silicon germanium heterostructures to metal–oxide–semiconductor field–effect transistors," Ph.D. Thesis, Stanford University Dept. of Electrical Engineering, 1995.

* cited by examiner

| TYPE OF SURFACE | AVERAGE ROUGHNESS (nm) |
| --- | --- |
| AS-GROWN GRADED COMPOSITION RELAXED SiGe | 7.9 |
| PLANARIZED SiGe | 0.57 |
| REGROWTH SiGe, LATTICE-MATCHED | ~0.6 |
| REGROWTH SiGe, LIGHT MISMATCH, THICKNESS = 1.5 μm | 0.77 |

FIG. 3

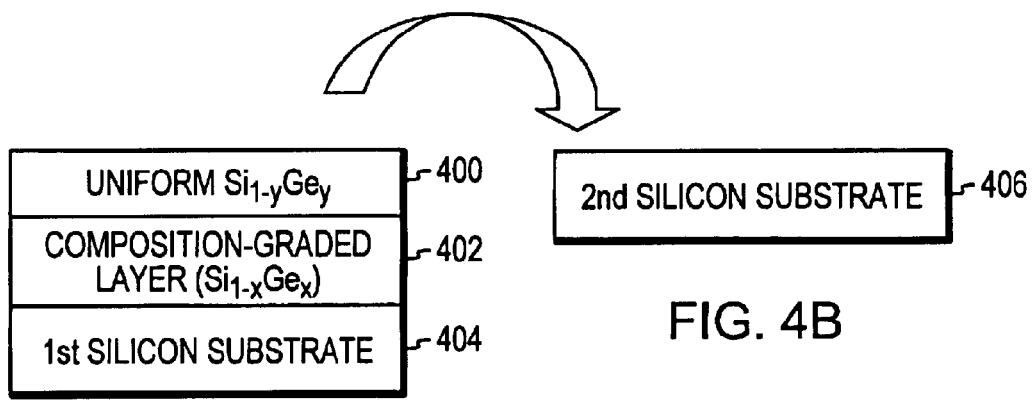
FIG. 4A
FIG. 4B
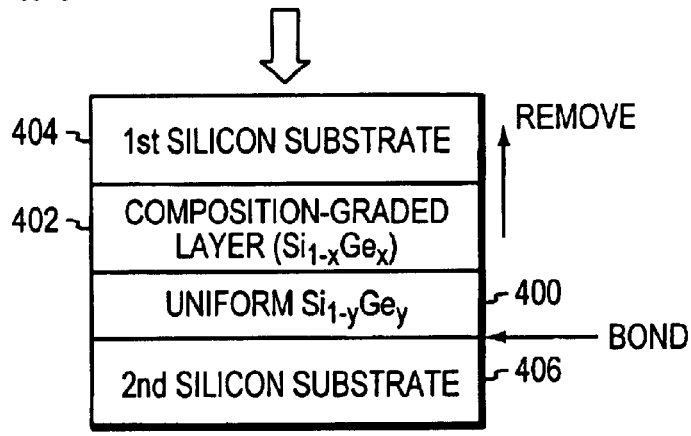
FIG. 4C
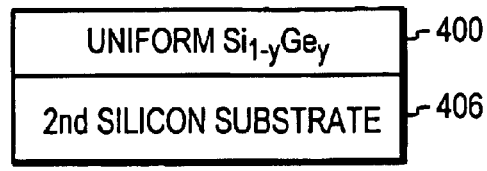
FIG. 4D

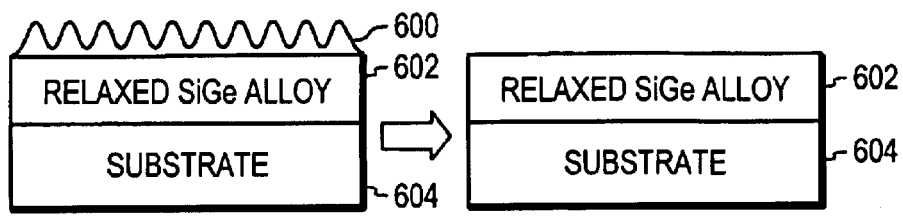
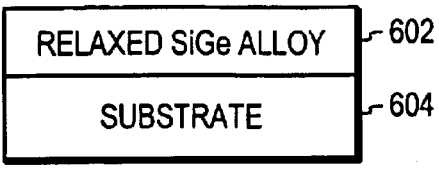
FIG. 6A    FIG. 6B
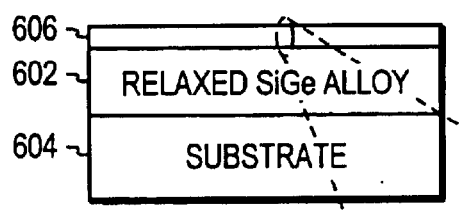
FIG. 6C
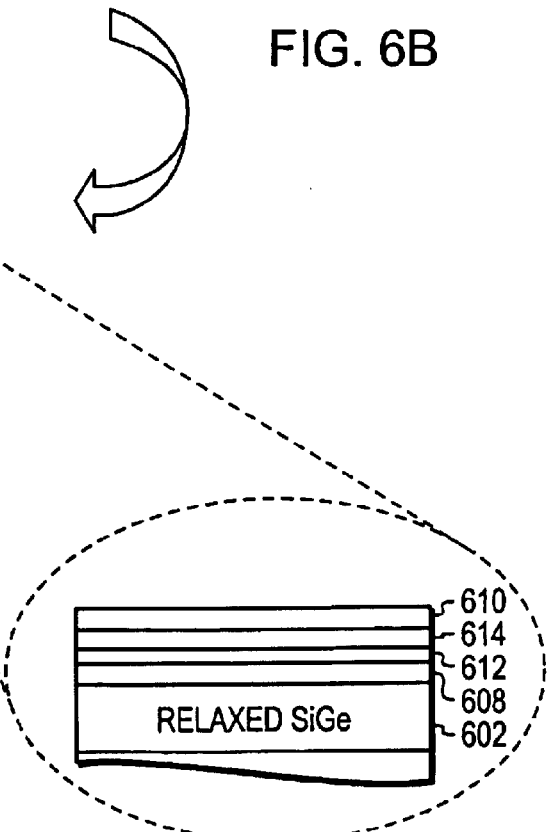
FIG. 6D

RELAXED SILICON GERMANIUM PLATFORM FOR HIGH SPEED CMOS ELECTRONICS AND HIGH SPEED ANALOG CIRCUITS

PRIORITY INFORMATION

This application claims priority from provisional application Ser. No. 60/273,112 filed Mar. 2, 2001.

BACKGROUND OF THE INVENTION

The invention relates to the field of relaxed SiGe platforms for high speed CMOS electronics and high speed analog circuits.

Si CMOS as a platform for digital integrated circuits has progressed predictably through the industry roadmap. The progress is created through device miniaturization, leading to higher performance, greater reliability, and lower cost. However, new bottlenecks in data flow are appearing as the interconnection hierarchy is expanded. Although digital integrated circuits have progressed at unprecedented rates, analog circuitry has hardly progressed at all. Furthermore, it appears that in the near future, serious economic and technological issues will confront the progress of digital integrated circuits.

The digital and communication chip markets need an enhancement to Si CMOS and the maturing roadmap. One promising candidate material that improves digital integrated circuit technology and introduces new analog integrated circuit possibilities is relaxed SiGe material on Si substrates. Relaxed SiGe alloys on Si can have thin layers of Si deposited on them, creating tension in the thin Si layers. Tensile Si layers have many advantageous properties for the basic device in integrated circuits, the metal-oxide field effect transistor (MOSFET). First, placing Si in tension increases the mobility of electrons moving parallel to the surface of the wafer, thus increasing the frequency of operation of the MOSFET and the associated circuit. Second, the band offset between the relaxed SiGe and the tensile Si will confine electrons in the Si layer. Therefore, in an electron channel device (n-channel), the channel can be removed from the surface or 'buried'. This ability to spatially separate the charge carriers from scattering centers such as ionized impurities and the 'rough' oxide interface enables the production of low noise, high performance analog devices and circuits.

A key development in this field was the invention of relaxed SiGe buffers with low threading dislocation densities. The key background inventions in this area are described in U.S. Pat. No. 5,442,205 issued to Brasen et al. and U.S. Pat. No. 6,107,653 issued to Fitzgerald. These patents define the current best methods of fabricating high quality relaxed SiGe.

Novel device structures in research laboratories have been fabricated on early, primitive versions of the relaxed buffer. For example, strained Si, surface channel nMOSFETs have been created that show enhancements of over 60% in intrinsic $g_m$ with electron mobility increases of over 75% (Rim et al, IEDM 98 Tech. Dig. p. 707). Strained Si, buried channel devices demonstrating high transconductance and high mobility have also been fabricated (U. Konig, MRS Symposium Proceedings 533, 3 (1998)). Unfortunately, these devices possess a variety of problems with respect to commercialization. First, the material quality that is generally available is insufficient for practical utilization, since the surface of SiGe on Si becomes very rough as the material is relaxed via dislocation introduction. These dislocations are essential in the growth of relaxed SiGe layers on Si since they compensate for the stress induced by the lattice mismatch between the materials. For more than 10 years, researchers have tried to intrinsically control the surface morphology through epitaxial growth, but since the stress fields from the misfit dislocations affect the growth front, no intrinsic epitaxial solution is possible. The invention describes a method of planarization and regrowth that allows all devices on relaxed SiGe to possess a significantly flatter surface. This reduction in surface roughness increases the yield for fine-line lithography, thus enabling the manufacture of strained Si devices.

A second problem with the strained Si devices made to date is that researchers have been concentrating on devices optimized for very different applications. The surface channel devices have been explored to enhance conventional MOSFET devices, whereas the buried channel devices have been constructed in ways that mimic the buried channel devices previously available only in III–V materials systems, like AlGaAs/GaAs. Recognizing that the Si manufacturing infrastructure needs a materials platform that is compatible with Si, scalable, and capable of being used in the plethora of Si integrated circuit applications, the disclosed invention provides a platform that allows both the enhancement of circuits based on Si CMOS, as well as the fabrication of analog circuits. Thus, high performance analog or digital systems can be designed with this platform. An additional advantage is that both types of circuits can be fabricated in the CMOS process, and therefore a combined, integrated digital/analog system can be designed as a single-chip solution.

With these advanced SiGe material platforms, it is now possible to provide a variety of device and circuit topologies that take advantage of this new materials system. Exemplary embodiments of the invention describe structures and methods to fabricate advanced strained-layer Si devices, and structures and methods to create circuits based on a multiplicity of devices, all fabricated from the same starting material platform. Starting from the same material platform is key to minimizing cost as well as to allowing as many circuit topologies to be built on this platform as possible.

SUMMARY OF THE INVENTION

Accordingly, the invention provides a material platform of planarized relaxed SiGe with regrown device layers. The planarization and regrowth strategy allows device layers to have minimal surface roughness as compared to strategies in which device layers are grown without planarization. This planarized and regrown platform is a host for strained Si devices that can possess optimal characteristics for both digital and analog circuits. Structures and processes are described that allow for the fabrication of high performance digital logic or analog circuits, but the same structure can be used to host a combination of digital and analog circuits, forming a single system-on-chip.

BRIEF DESCRIPTION OF THE DRAWINGS

FIG. 3 is a table showing surface roughness data for relaxed SiGe buffers produced by dislocation injection via graded SiGe layers on Si substrates;

FIGS. 4A–4D show an exemplary process flow and resulting platform structure in accordance with the invention;

FIGS. 6A–6D are schematic diagrams of the corresponding process flow and layer structure for a buried channel FET platform in accordance with the invention;

DETAILED DESCRIPTION OF THE INVENTION

Figure 1:
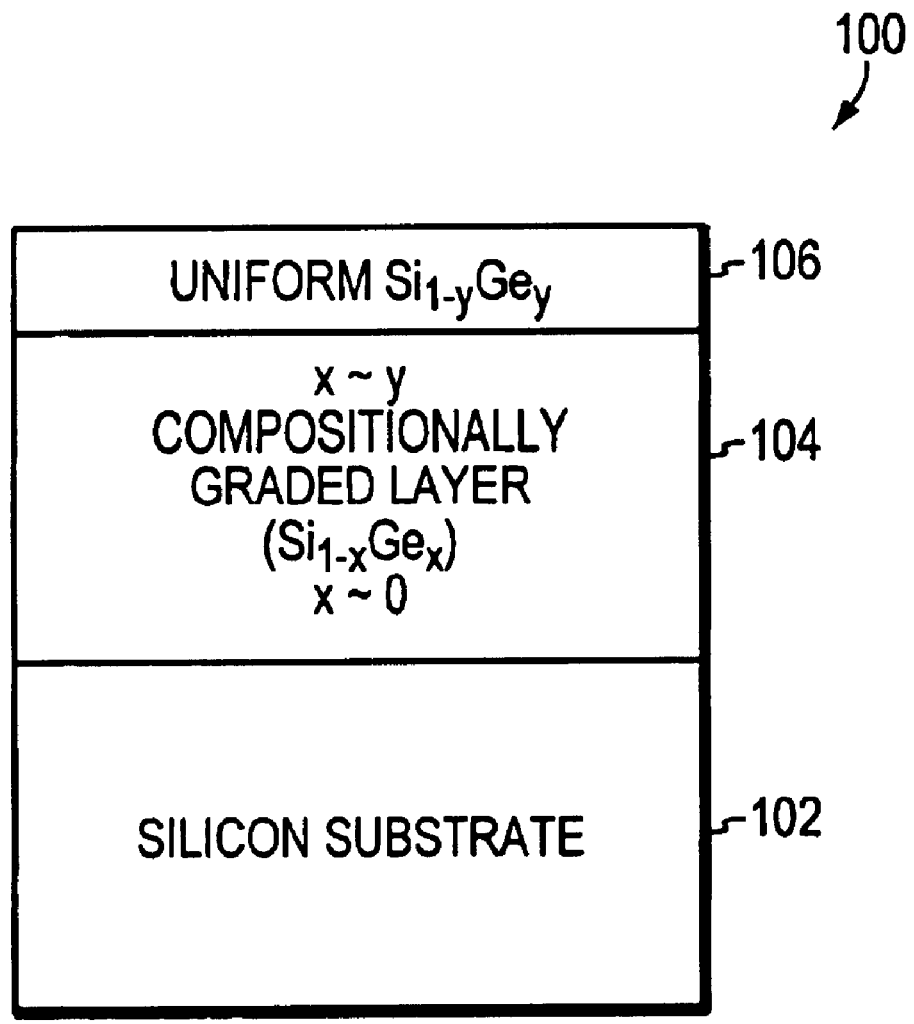
FIG. 1 is a schematic block diagram of a structure including a relaxed SiGe layer epitaxially grown on a Si substrate.

FIG. 1 is a schematic block diagram of a structure 100 including a relaxed SiGe layer epitaxially grown on a Si substrate 102. In this structure, a compositionally graded buffer layer 104 is used to accommodate the lattice mismatch between the uniform SiGe layer 106 and the Si substrate. By spreading the lattice mismatch over a distance, the graded buffer minimizes the number of dislocations reaching the surface and thus provides a method for growing high-quality relaxed SiGe films on Si.

Any method of growing a high-quality, relaxed SiGe layer on Si will produce roughness on the surface of the SiGe layer in a well-known crosshatch pattern. This crosshatch pattern is typically a few hundred angstroms thickness over distances of microns. Thus, the crosshatch pattern is a mild, undulating surface morphology with respect to the size of the electron or hole. For that reason, it is possible to create individual devices that achieve enhancements over their control Si device counterparts. However, commercialization of these devices requires injection of the material into the Si CMOS process environment to achieve low cost, high performance targets. This processing environment requires that the material and device characteristics have minimal impact on the manufacturing process. The crosshatch pattern on the surface of the wafer is one limiting characteristic of relaxed SiGe on Si that affects the yield and the ease of manufacture. Greater planarity is desired for high yield and ease in lithography.

Figure 2:
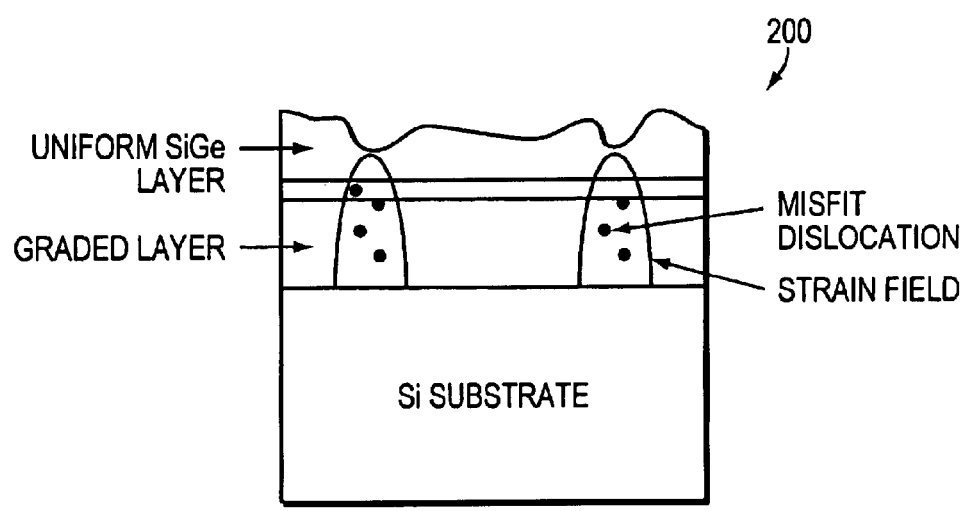
FIG. 2 is a schematic block diagram of an exemplary structure showing that the origin of the crosshatch pattern is the stress fields from injected misfit dislocations.

The origin of the crosshatch pattern is the stress fields from the injected misfit dislocations. This effect is depicted by the exemplary structure 200 shown in FIG. 2. By definition, the dislocations must be introduced in order to accommodate the lattice-mismatch between the SiGe alloy and the Si substrate. The stress fields originate at the dislocations, and are terminated at the surface of the film. However, the termination at the surface creates crystal lattices that vary from place to place on the surface of the wafer. Since growth rate can be correlated to lattice constant size, different thicknesses of deposition occur at different points on the wafer. One may think that thick layer growth beyond the misfit dislocations will smooth the layer of these thickness differences. Unfortunately, the undulations on the surface have a relatively long wavelength; therefore, surface diffusion is typically not great enough to remove the morphology.

FIG. 3 is a table that displays surface roughness data for relaxed SiGe buffers produced by dislocation injection via graded SiGe layers on Si substrates. Note that the as-grown crosshatch pattern for relaxed $Si_{0.8}Ge_{0.2}$ buffers creates a typical roughness of approximately 7.9 nm. This average roughness increases as the Ge content in the relaxed buffer is increased. Thus, for any SiGe layer that is relaxed through dislocation introduction during growth, the surface roughness is unacceptable for state-of-the-art fabrication facilities. After the process in which the relaxed SiGe is planarized, the average roughness is less than 2 nm (typically 0.57 nm), and after device layer deposition, the average roughness is 0.77 nm with a 1.5 $\mu$m regrowth thickness. Therefore, after the complete structure is fabricated, over one order of magnitude of roughness reduction can be achieved.

The regrowth device layers can be either greater than or less than the critical thickness of the regrowth layer. In general, in any lattice-mismatched epitaxial growth, thin layers can be deposited without fear of dislocation introduction at the interface. At a great enough thickness, any lattice-mismatch between the film and substrate will introduce misfit dislocations into the regrown heterostructure. These new dislocations can cause additional surface roughness. Thus, if the lattice-mismatch between the regrowth device layers and relaxed SiGe buffer is too great, the effort of planarizing the relaxed SiGe may be lost since massive dislocation introduction will roughen the surface.

There are two distinct possibilities with respect to the regrowth thickness and the quality of surface. If the regrowth layers are very thin, then exact lattice matching of the regrowth layer composition and the relaxed buffer composition is not necessary. In this case, the surface roughness will be very low, approximately equal to the post-planarization flatness. However, in many applications for devices, the regrowth layer thickness will be 1–2 $\mu$m or more. For a 1% difference in Ge concentration between the relaxed SiGe and the regrowth layer, the critical thickness is approximately 0.5 $\mu$m. Thus, if optimal flatness is desired, it is best to keep the regrowth layer below approximately 0.5 $\mu$m unless excellent control of the uniformity of Ge concentration across the wafer is achieved. Although this composition matching is achievable in state-of-the-art tools, FIG. 3 shows that less precise matching, i.e., within 2% Ge, results in misfit dislocation introduction and introduction of a new crosshatch pattern. However, because the lattice mismatch is so small, the average roughness is still very low, approximately 0.77 nm. Thus, either lattice-matching or slight mismatch will result in excellent device layer surfaces for processing.

It is also noted that the relaxed SiGe alloy with surface roughness may not necessarily be a uniform composition relaxed SiGe layer on a graded composition layer. Although this material layer structure has been shown to be an early example of high quality relaxed SiGe, there are some disadvantages to this structure. For example, SiGe alloys possess a much worse coefficient of thermal conductivity than pure Si. Thus, for electronic devices located at the surface, it may be relatively difficult to guide the heat away from the device areas due to the thick graded composition layer and uniform composition layer.

Another exemplary embodiment of the invention, shown in FIGS. 4A–4D, solves this problem and creates a platform for high power SiGe devices. FIGS. 4A–4D show an exemplary process flow and resulting platform structure in accordance with the invention. The structure is produced by first forming a relaxed uniform SiGe alloy 400 via a compositionally graded layer 402 on a Si substrate 404. The SiGe layer 400 is then transferred to a second Si substrate 406 using conventional bonding. For example, the uniform SiGe alloy 400 on the graded layer 402 can be planarized to remove the crosshatch pattern, and that relaxed SiGe alloy can be bonded to the Si wafer. The graded layer 402 and the original substrate 404 can be removed by a variety of conventional processes. For example, one process is to grind the original Si substrate away and selectively etch to the SiGe, either by a controlled dry or wet etch, or by embedding an etch stop layer. The end result is a relaxed SiGe alloy 400 on Si without the thick graded layer. This structure is more suited for high power applications since the heat can be conducted away from the SiGe layer more efficiently.

The bond and substrate removal technique can also be used to produce SiGe on insulator substrates, or SGOI. An SGOI wafer is produced using the same technique shown in FIGS. 4A–4D; however, the second substrate is coated with a $SiO_2$ layer before bonding. In an alternative embodiment, both wafers can be coated with $SiO_2$ to enable oxide-to-oxide bonding. The resulting structure after substrate removal is a high quality, relaxed SiGe layer on an insulating film. Devices built on this platform can utilize the performance enhancements of both strained Si and the SOI architecture.

It will be appreciated that in the scenario where the SiGe layer is transferred to another host substrate, one may still need to planarize before regrowing the device layer structure. The SiGe surface can be too rough for state of the art processing due to the substrate removal technique. In this case, the relaxed SiGe is planarized, and the device layers are regrown on top of the high-quality relaxed SiGe surface.

Planarization of the surface via mechanical or other physical methods is required to flatten the surface and to achieve CMOS-quality devices. However, the field effect transistors (FETs) that allow for enhanced digital and analog circuits are very thin, and thus would be removed by the planarization step. Thus, a first part of the invention is to realize that relaxed SiGe growth and planarization, followed by device layer regrowth, is key to creating a high-performance, high yield enhanced CMOS platform. FIGS. 5 and 6 show the process sequence and regrowth layers required to create embodiments of surface channel and buried channel FETs, respectively.

Figures 5A, 5B:
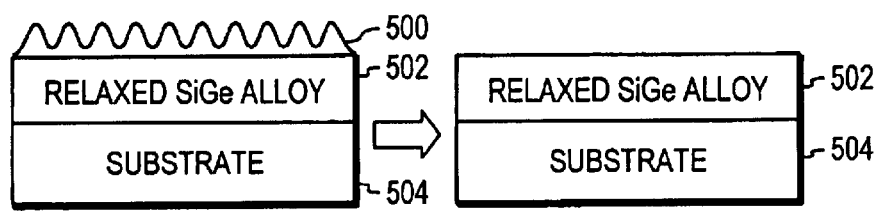
FIGS. 5A–5D are schematic diagrams of the corresponding process flow and layer structure for a surface channel FET platform in accordance with the invention.
Figure 5C:
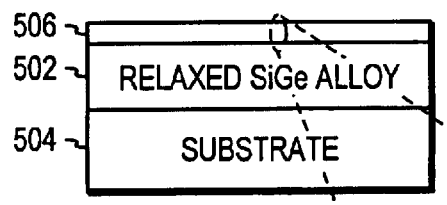
Figure 5D:
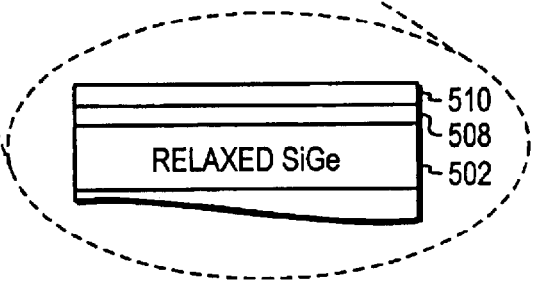

FIGS. 5A–5D are schematic diagrams of a process flow and resulting layer structure in accordance with the invention. FIG. 5A shows the surface roughness 500, which is typical of a relaxed SiGe alloy 502 on a substrate 504, as an exaggerated wavy surface. Note that the substrate is labeled in a generic way, since the substrate could itself be Si, a relaxed compositionally graded SiGe layer on Si, or another material in which the relaxed SiGe has been transferred through a wafer bonding and removal technique. The relaxed SiGe alloy 502 is planarized (FIG. 5B) to remove the substantial roughness, and then device regrowth layers 506 are epitaxially deposited (FIG. 5C). It is desirable to lattice-match the composition of the regrowth layer 506 as closely as possible to the relaxed SiGe 502; however, a small amount of mismatch and dislocation introduction at the interface is tolerable since the surface remains substantially planar. For a surface channel device, a strained Si layer 508 of thickness less than 0.1 $\mu$m is then grown on top of the relaxed SiGe 502 with an optional sacrificial layer 510, as shown in FIG. 5D. The strained layer 508 is the layer that will be used as the channel in the final CMOS devices.

FIGS. 6A–6D are schematic diagrams of the corresponding process flow and layer structure for a buried channel FET platform in accordance with the invention. In this structure, the regrowth layers 606 include a lattice matched SiGe layer 602, a strained Si channel layer 608 with a thickness of less than 0.05 $\mu$m, a SiGe separation or spacer layer 612, a Si gate oxidation layer 614, and an optional sacrificial layer 610 used to protect the heterostructure during the initial device processing steps.

Figure 7A:
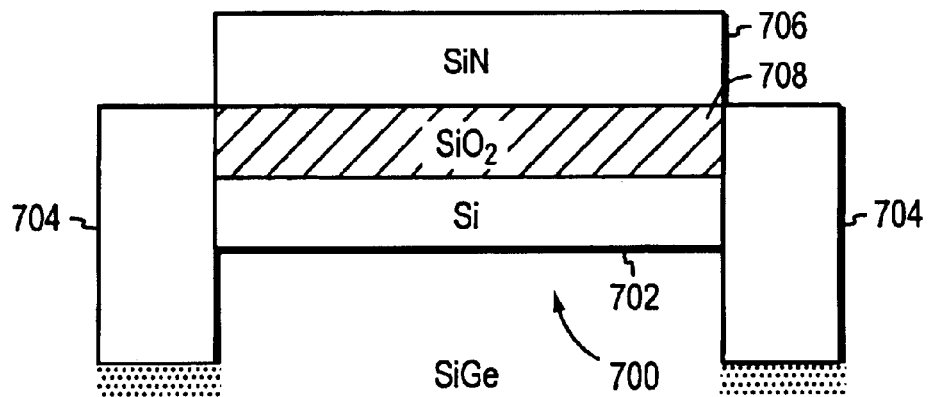
FIGS. 7A–7D are schematic diagrams of a process flow for a surface channel MOSFET in accordance with the invention.
Figure 7B:
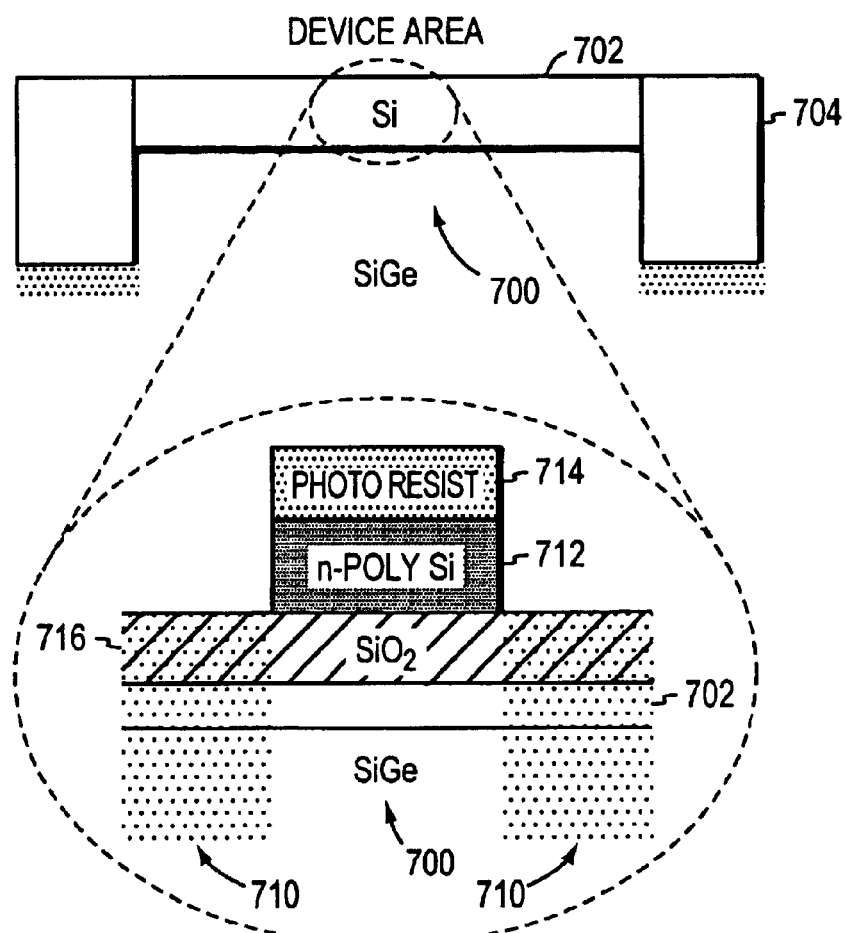
Figure 7C:
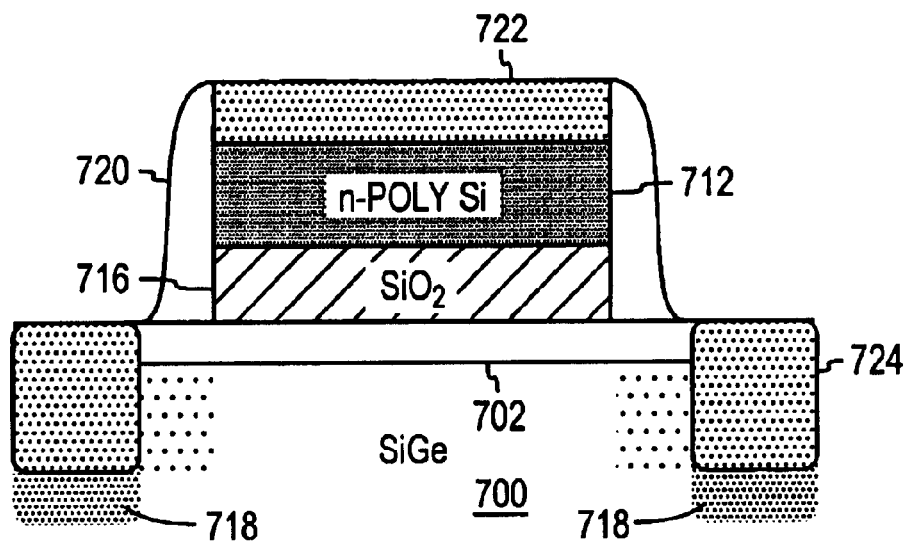
Figure 7D:
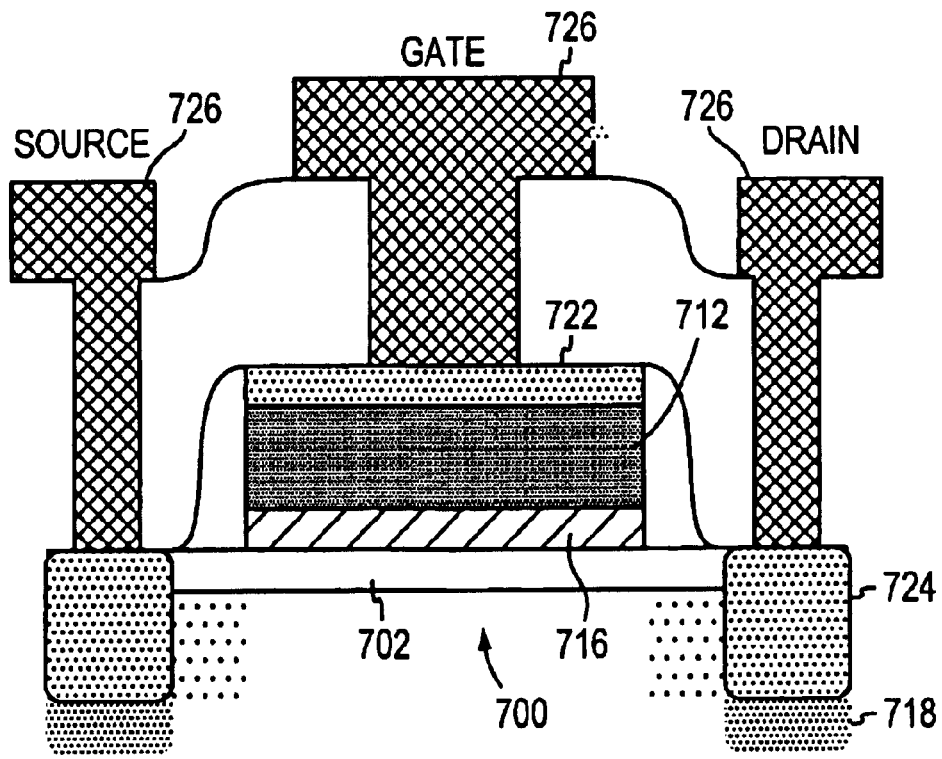

Once the device structure has been deposited, the rest of the process flow for device fabrication is very similar to that of bulk Si. A simplified version of the process flow for a surface channel MOSFET in accordance with the invention is shown in FIGS. 7A–7D. This surface channel MOSFET contains a relaxed SiGe layer 700 and a strained Si layer 702. The device isolation oxide 704, depicted in FIG. 7A, is typically formed first. In this step, the SiN layer 706, which is on top of a thin pad oxide layer 708, serves as a hard mask for either local oxidation of silicon (LOCOS) or shallow trench isolation (STI). Both techniques use a thick oxide (relative to device dimensions) to provide a high threshold voltage between devices; however, STI is better suited for sub-quarter-micron technologies. FIG. 7B is a schematic of the device area after the gate oxide 716 growth and the shallow-source drain implant. The implant regions 710 are self-aligned by using a poly-Si gate 712 patterned with photoresist 714 as a masking layer. Subsequently, deep source-drain implants 718 are positioned using conventional spacer 720 formation and the device is electrically contacted through the formation of silicide 722 at the gate and silicide/germanides 724 at the source and drain (FIG. 7C). FIG. 7D is a schematic of the device after the first level of metal interconnects 726 have been deposited and etched.

Since there are limited-thickness layers on top of the entire structure, the removal of surface material during processing becomes more critical than with standard Si. For surface channel devices, the structure that is regrown consists primarily of nearly lattice-matched SiGe, and a thin surface layer of strained Si. Many of the processes that are at the beginning of a Si fabrication sequence strip Si from the surface. If the processing is not carefully controlled, the entire strained Si layer can be removed before the gate oxidation. The resulting device will be a relaxed SiGe channel FET and thus the benefits of a strained Si channel will not be realized.

A logical solution to combat Si removal during initial processing is to make the strained Si layer thick enough to compensate for this removal. However, thick Si layers are not possible for two reasons. First, the enhanced electrical properties originate from the fact that the Si is strained and thick layers experience strain relief through the introduction of misfit dislocations. Second, the misfit dislocations themselves are undesirable in significant quantity, since they can scatter carriers and increase leakage currents in junctions.

Figure 8A:
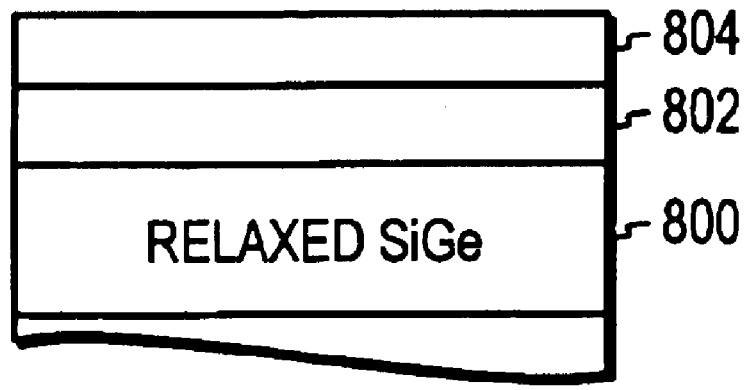
FIGS. 8A and 8B are schematic block diagrams of surface channel devices with protective layers.
Figure 8B:

In order to prevent removal of strained Si layers at the surface, the cleaning procedures before gate oxidation must be minimized and/or protective layers must be applied. Protective layers are useful since their removal can be carefully controlled. Some examples of protective layers for surface channel devices are shown in FIGS. 8A and 8B. FIG. 8A shows a strained Si heterostructure of a relaxed SiGe layer 800 and a strained Si channel layer 802 protected by a surface layer 804 of SiGe. The surface SiGe layer 804 should have a Ge concentration similar to that of the relaxed SiGe layer 800 below, so that the thickness is not limited by critical thickness constraints. During the initial cleans, the SiGe sacrificial layer is removed instead of the strained Si channel layer. The thickness of the sacrificial layer can either be tuned to equal the removal thickness, or can be made greater than the removal thickness. In the latter case, the excess SiGe can be selectively removed before the gate oxidation step to reveal a clean, strained Si layer at the as grown thickness. If the particular fabrication facility prefers a Si terminated surface, a sacrificial Si layer may be deposited on top of the SiGe sacrificial cap layer.

FIG. 8B shows a structure where a layer 806 of $SiO_2$ and a surface layer 808 of either a poly-crystalline or an amorphous material are used as protective layers. In this method, an oxide layer is either grown or deposited after the epitaxial growth of the strained Si layer. Subsequently, a polycrystalline or amorphous layer of Si, SiGe, or Ge is deposited. These semiconductor layers protect the strained-Si layer in the same manner as a SiGe cap during the processing steps before gate oxidation. Prior to gate oxidation, the poly/amorphous and oxide layers are selectively removed. Although the sacrificial layers are shown as protection for a surface channel device, the same techniques can be employed in a buried channel heterostructure.

Another way in which conventional Si processing is modified is during the source-drain silicide-germanide formation (FIG. 7C). In conventional Si processing, a metal (typically Ti, Co, or Ni) is reacted with the Si and, through standard annealing sequences, low resistivity silicides are formed. However, in this case, the metal reacts with both Si and Ge simultaneously. Since the silicides have much lower free energy than the germanides, there is a tendency to form a silicide while the Ge is expelled. The expelled germanium creates agglomeration and increases the resistance of the contacts. This increase in series resistance offsets the benefits of the extra drive current from the heterostructure, and negates the advantages of the structure.

Ti and Ni can form phases in which the Ge is not rejected severely, thus allowing the formation of a good contact. Co is much more problematic. However, as discussed above for the problem of Si removal, a protective layer(s) at the device epitaxy stage can be applied instead of optimizing the SiGe-metal reaction. For example, the strained Si that will become the surface channel can be coated with a high-Ge-content SiGe alloy (higher Ge content than the initial relaxed SiGe), followed by strained Si. Two approaches are possible using these surface contact layers. Both methods introduce thick Si at the surface and allow the conventional silicide technology to be practiced without encountering the problems with SiGe-metal reactions.

Figure 9A:
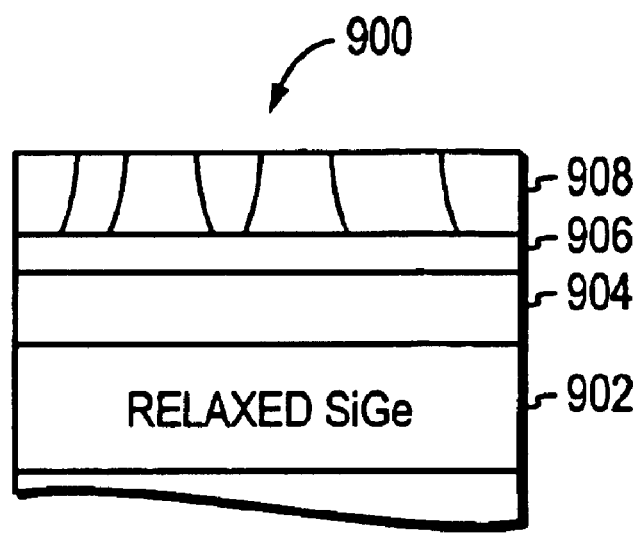
FIGS. 9A and 9B are schematic block diagrams of surface channel devices with Si layers on Ge-rich layers for use in silicide formation.

The first approach, shown on a surface channel heterostructure 900 in FIG. 9A, uses a Ge-rich layer 906 thin enough that it is substantially strained. The layer 906 is provided on a strained Si channel layer 904 and relaxed SiGe layer 902. In this case, if a subsequent Si layer 908 is beyond the critical thickness, the compressive Ge-rich layer 906 acts as a barrier to dislocations entering the strained Si channel 904. This barrier is beneficial since dislocations do not adversely affect the silicide process; thus, their presence in the subsequent Si layer 908 is of no consequence. However, if the dislocations were to penetrate to the channel, there would be adverse effects on the device.

Figure 9B:

A second approach, shown in FIG. 9B, is to allow a Ge-rich layer 910 to intentionally exceed the critical thickness, thereby causing substantial relaxation in the Ge-rich layer. In this scenario, an arbitrarily thick Si layer 912 can be applied on top of the relaxed Ge-rich layer. This layer will contain more defects than the strained channel, but the defects play no role in device operation since this Si is relevant only in the silicide reaction. In both cases, the process is free from the metal-SiGe reaction concerns, since the metal will react with Si-only. Once the silicide contacts have been formed, the rest of the sequence is a standard Si CMOS process flow, except that the thermal budget is carefully monitored since, for example, the silicide-germanicide (if that option is used) typically cannot tolerate as high a temperature as the conventional silicide. A major advantage of using Si/SiGe FET heterostructures to achieve enhanced performance is the compatibility with conventional Si techniques. Many of the processes are identical to Si CMOS processing, and once the front-end of the process, i.e., the processing of the Si/SiGe heterostructure, is complete, the entire back-end process is uninfluenced by the fact that Si/SiGe lies below.

Figure 10:
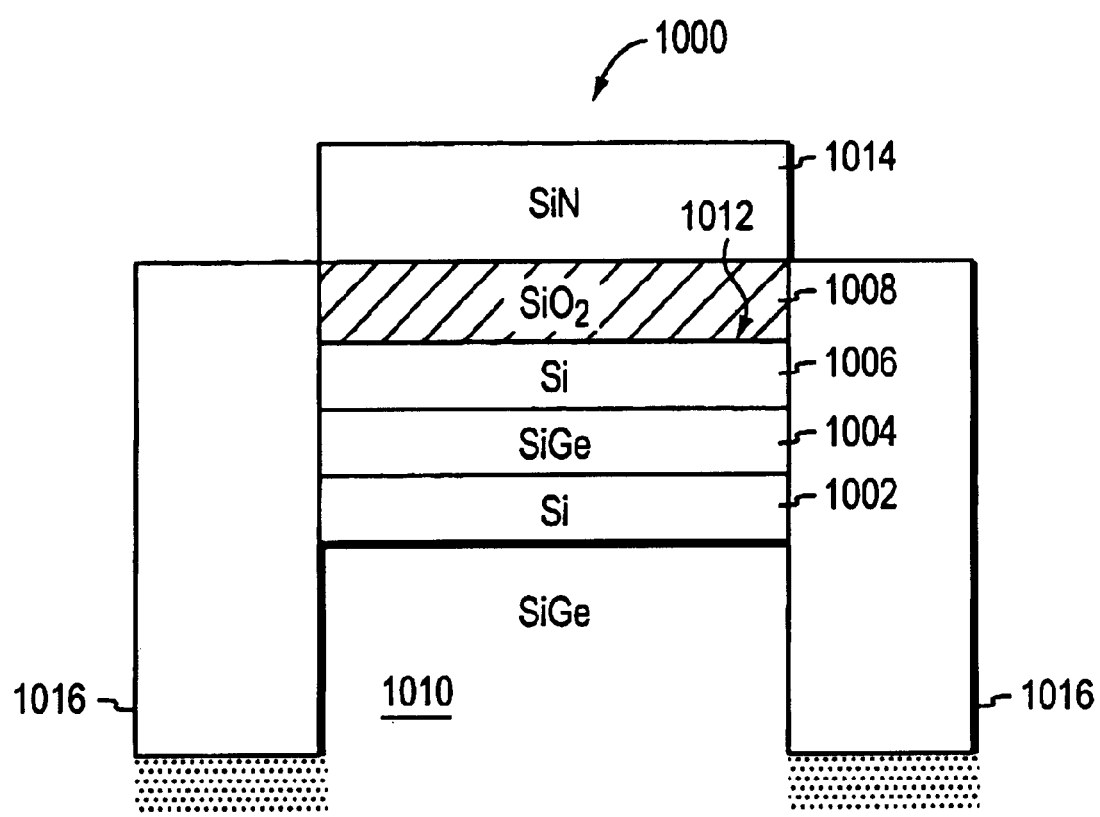
FIG. 10 is schematic diagram of a buried channel MOSFET after device isolation in accordance with the invention.

Even though the starting heterostructure for the buried channel device is different from that of the surface channel device, its process flow is very similar to the surface channel flow shown in FIGS. 7A–7D. FIG. 10 is a schematic block diagram of a buried channel MOSFET structure 1000 after the device isolation oxide 1016 has been formed using a SiN mask 1014. In this case, the strained channel 1002 on a first SiGe layer 1010 is separated from the surface by the growth of another SiGe layer 1004, followed by another Si layer 1006. This Si layer is needed for the gate oxide 1008 since gate-oxide formation on SiGe produces a very high interface state density, thus creating non-ideal MOSFETs. One consequence of this Si layer, is that if it is too thick, a substantial portion of the Si layer will remain after the gate oxidation. Carriers can populate this residual Si layer, creating a surface channel in parallel with the desired buried channel and leading to deleterious device properties. Thus, the surface layer Si must be kept as thin as possible, typically less than 50 Å and ideally in the range of 5–15 Å.

Another added feature that is necessary for a buried channel device is the supply layer implant. The field experienced in the vertical direction when the device is turned on is strong enough to pull carriers from the buried channel 1002 and force them to populate a Si channel 1006 near the $Si/SiO_2$ interface 1012, thus destroying any advantage of the buried channel. Thus, a supply layer of dopant must be introduced either in the layer 1004 between the buried channel and the top Si layer 1006, or below the buried channel in the underlying SiGe 1010. In this way, the device is forced on with little or no applied voltage, and turned off by applying a voltage (depletion mode device).

Figure 11:
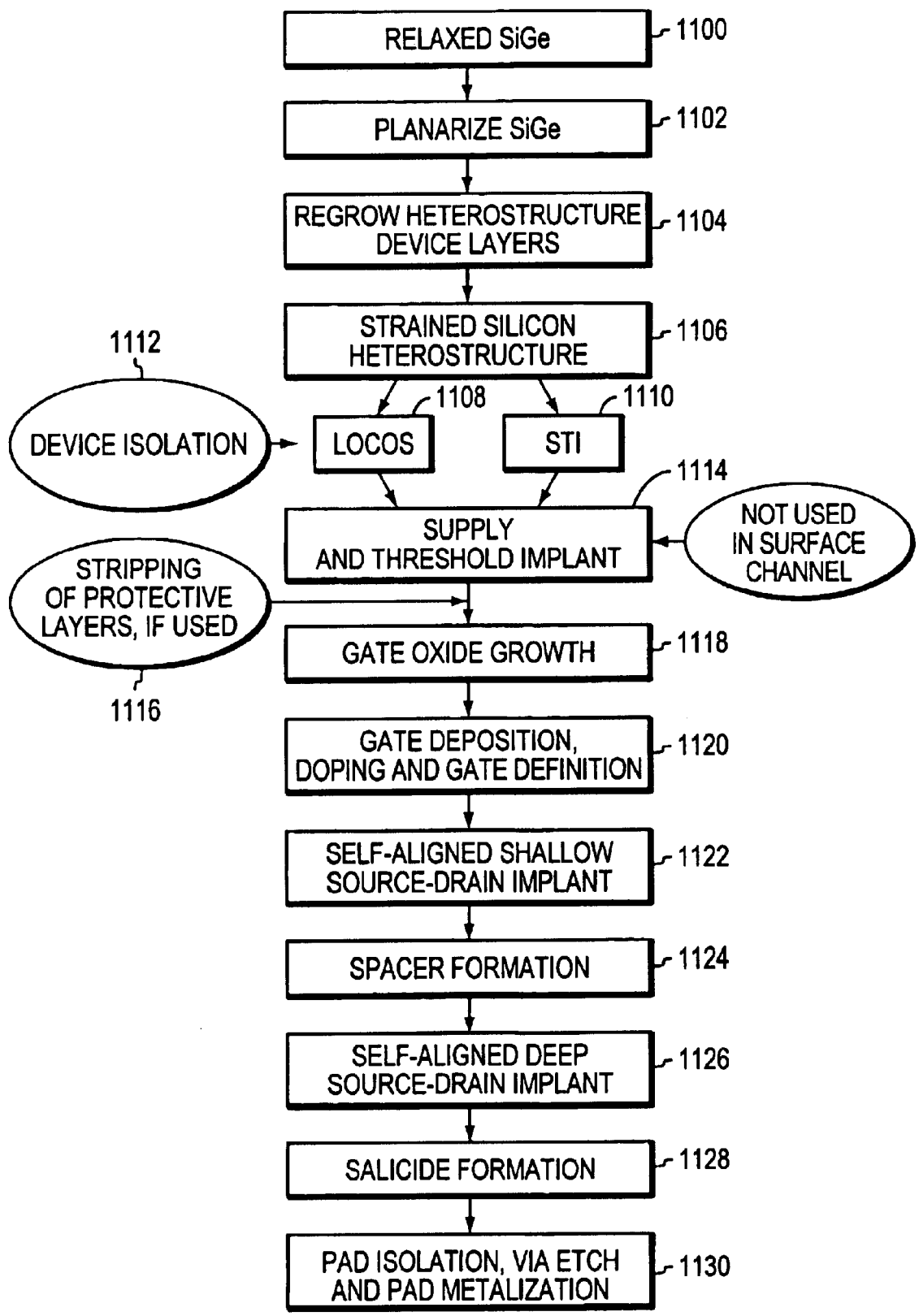
FIG. 11 is a schematic flow of the process, for any heterostructure FET device deposited on relaxed SiGe, in accordance with the invention.

FIG. 11 is a schematic flow of the process, for any heterostructure FET device deposited on relaxed SiGe, in accordance with the invention. The main process steps are shown in the boxes, and optional steps or comments are shown in the circles. The first three steps (1100,1102,1104) describe the fabrication of the strained silicon heterostructure. The sequence includes production of relaxed SiGe on Si, planarization of the SiGe, and regrowth of the device layers. Once the strained heterostructure is complete (1106), MOS fabrication begins with device isolation (1112) using either STI (1110) or LOCOS (1108). Before proceeding to the gate oxidation, buried channel devices undergo a supply and threshold implant (1114), and any protective layers applied to either a buried or surface channel heterostructure must be selectively removed (1116). The processing sequence after the gate oxidation (1118) is similar to conventional Si CMOS processing. These steps include gate deposition, doping, and definition (1120), self-aligned shallow source-drain implant (1122), spacer formation (1124), self-aligned deep source-drain implant (1126), salicide formation (1128), and pad isolation via metal deposition and etch (1130). The steps requiring significant alteration have been discussed.

One particular advantage of the process of FIG. 11 is that it enables the use of surface channel and buried channel devices on the same platform. Consider FIGS. 12A–12D and FIGS. 13A–13D, which show a universal substrate layer configuration and a process that leads to the co-habitation of surface and buried channel MOSFETs on the same chip. The universal substrate is one in which both surface channel and buried channel devices can be fabricated. There are two possibilities in fabricating the surface channel device in this sequence, shown in FIGS. 12 and 13. The process flows for combining surface and buried channel are similar to the previous process described in FIG. 7. Therefore, only the critical steps involved in exposing the proper gate areas are shown in FIGS. 12 and 13.

Figure 12A:
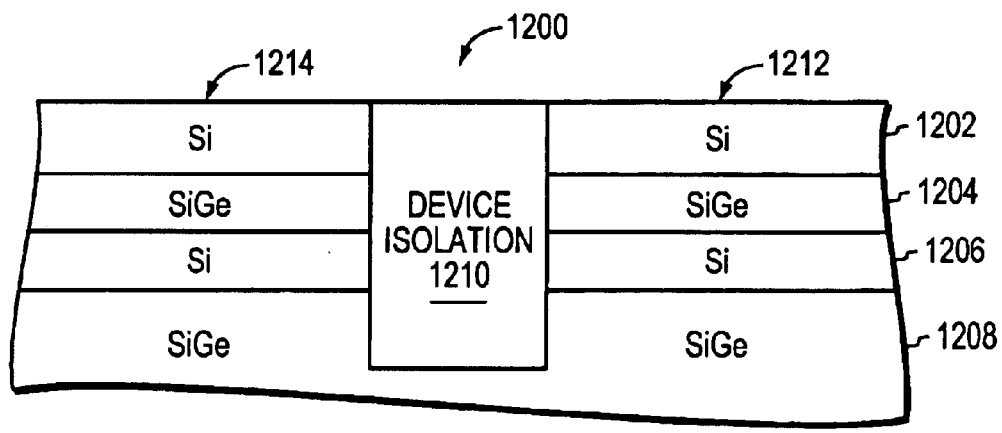
FIGS. 12A–12D are schematic diagrams of a process flow in the case of forming the surface channel MOSFET in the top strained Si layer in accordance with the invention.
Figure 13A:
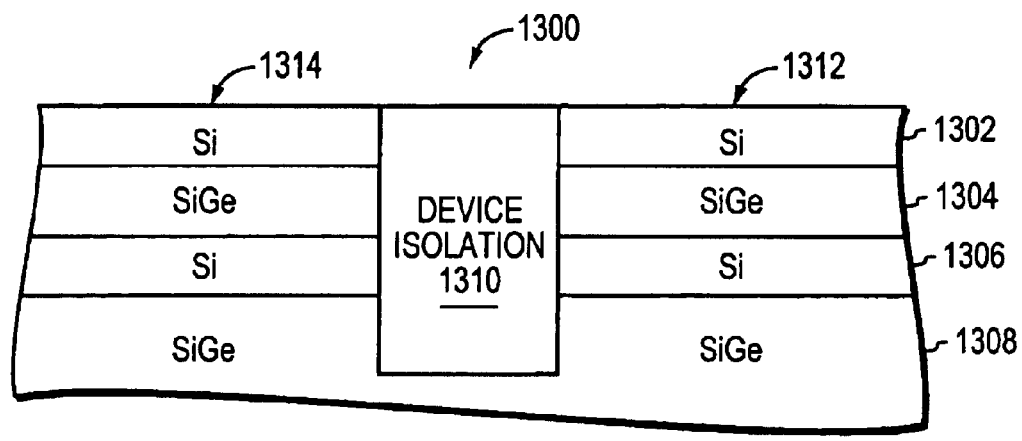
FIGS. 13A–13D are schematic diagrams of a process flow in the case of forming the surface channel MOSFET in the buried strained Si layer in accordance with the invention.

FIGS. 12A and 13A depict the same basic heterostructure 1200,1300 for integrating surface channel and buried channel devices. There is a surface strained Si layer 1202,1302, a SiGe spacer layer 1204,1304, a buried strained Si layer 1206,1306, and a relaxed platform of SiGe 1208,1308. Two strained Si layers are necessary because the buried channel MOSFET requires a surface Si layer to form the gate oxide and a buried Si layer to form the device channel. The figures also show a device isolation region 1210 that separates the buried channel device area 1212,1312 from the surface channel device area 1214,1314.

Figure 12B:
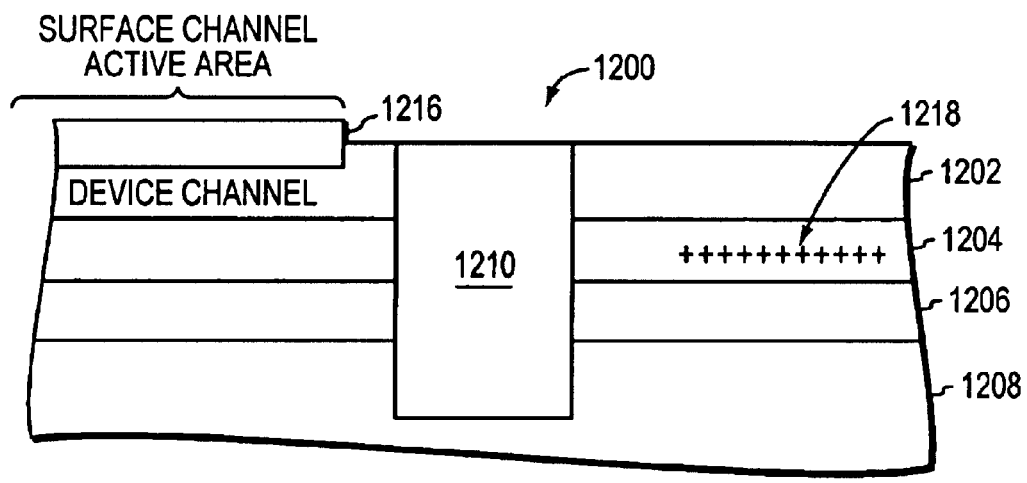
Figure 12C:
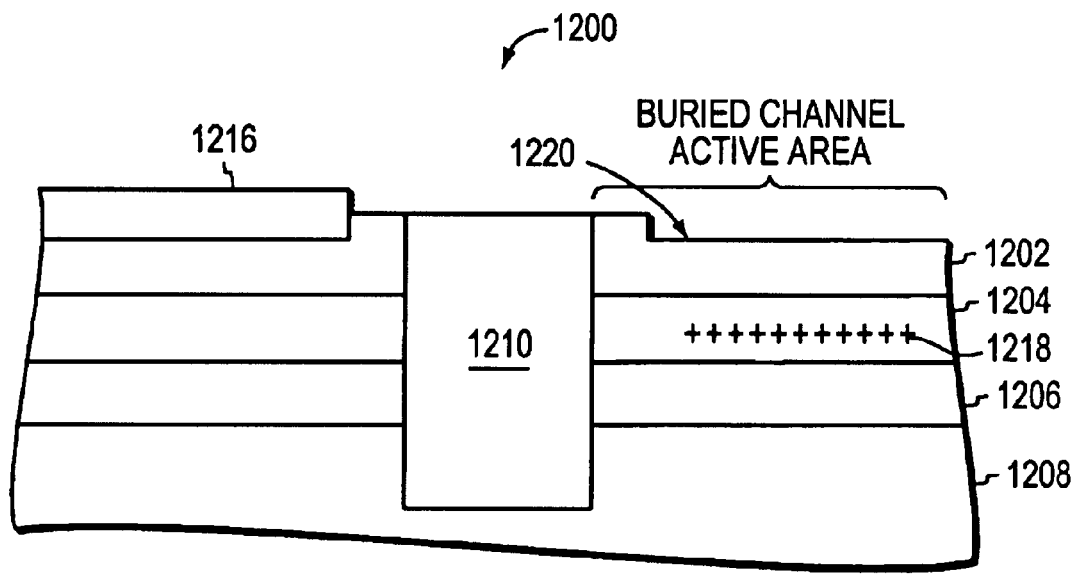
Figure 12D:
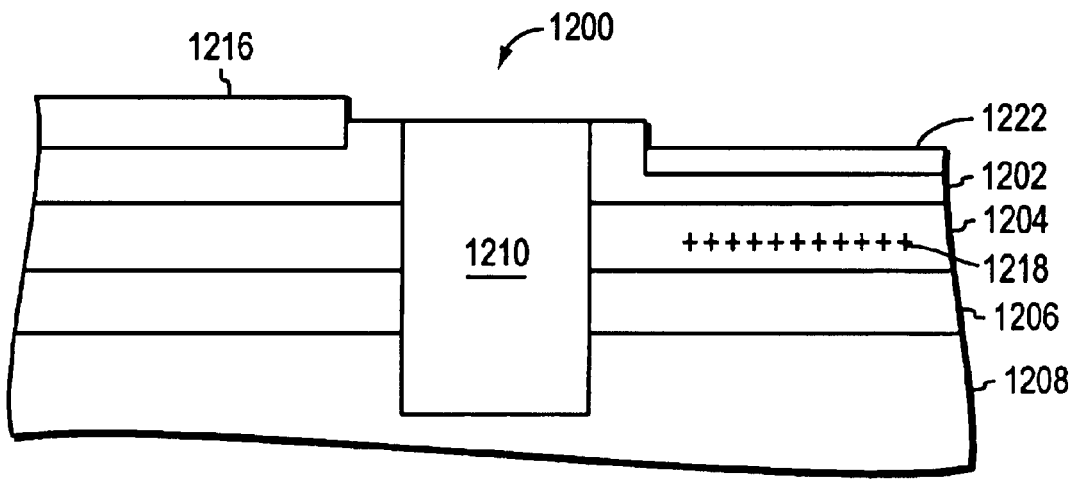
Figure 13B:
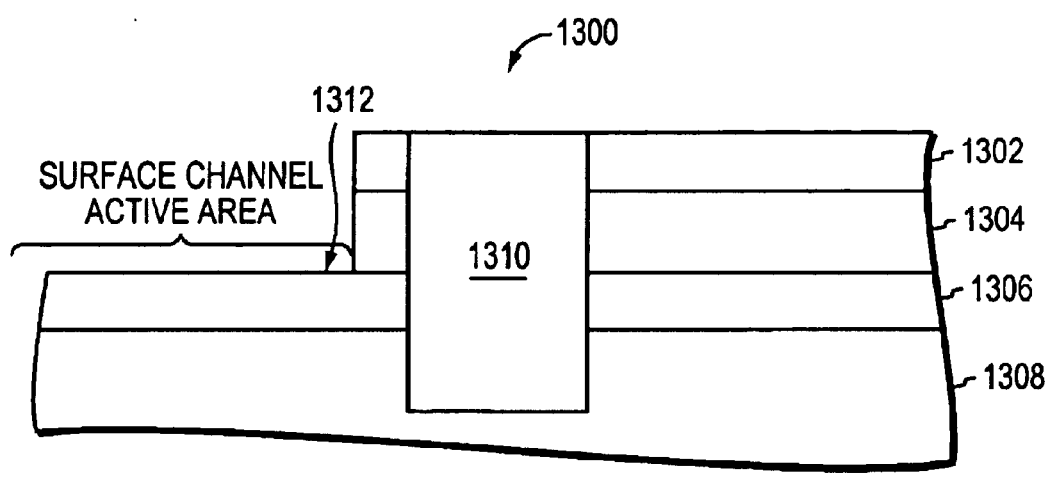
Figure 13C:
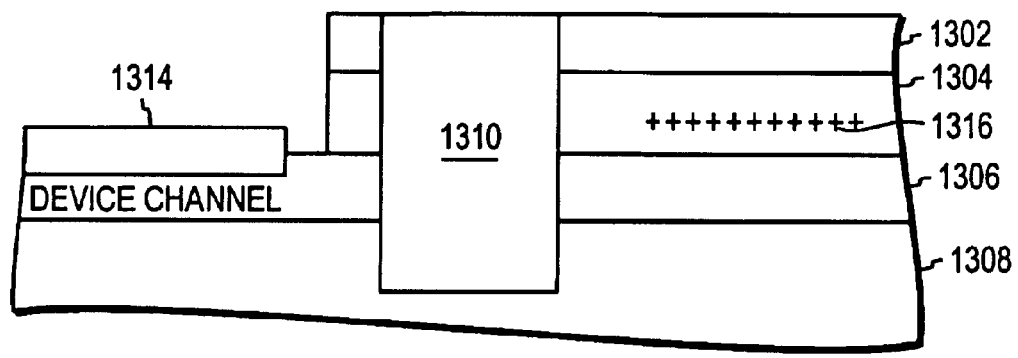
Figure 13D:
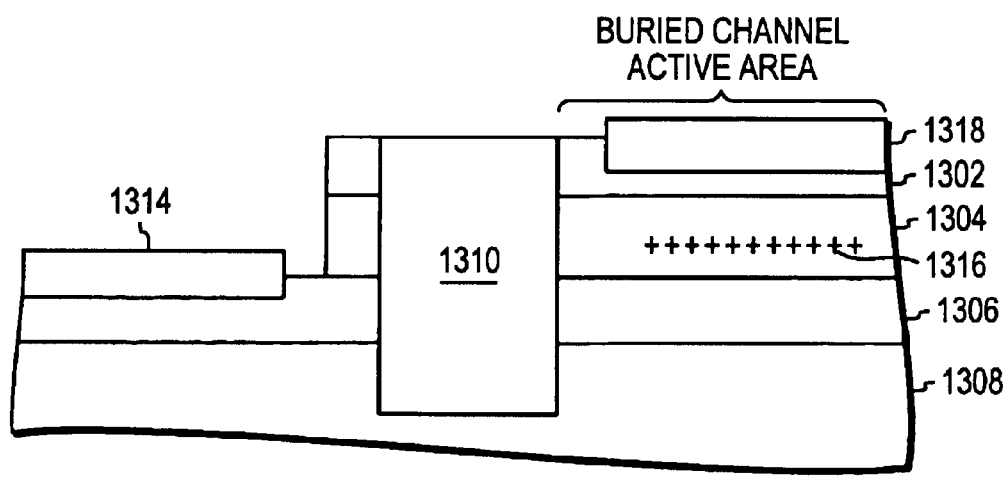

Unlike the buried channel device, a surface channel MOSFET only requires one strained Si layer. As a result, the surface channel MOSFET can be fabricated either in the top strained Si layer, as shown in FIGS. 12B–12D, or the buried Si layer channel, as shown in FIGS. 13B–13D. FIG. 12B is a schematic diagram of a surface channel gate oxidation 1216 in the top Si layer 1202. In this scenario, a thicker top Si layer is desired, since after oxidation, a residual strained Si layer must be present to form the channel. FIG. 12B also shows a possible position for the buried channel supply implant 1218, which is usually implanted before the buried channel gate oxide is grown. Since the top Si layer is optimized for the surface channel device, it may be necessary to strip some of the top strained Si in the regions 1220 where buried channel devices are being created, as shown in FIG. 12C. This removal is necessary in order to minimize the surface Si thickness after gate oxide 1222 formation (FIG. 12D), and thus avoid the formation of a parallel device channel.

When a surface channel MOSFET is formed in the buried strained Si layer, the top strained Si layer can be thin, i.e., designed optimally for the buried channel MOSFET. In FIG. 13B, the top strained Si and SiGe layers are removed in the region 1312 where the surface channel MOSFETs are formed. Because Si and SiGe have different properties, a range of selective removal techniques can be used, such as wet or dry chemical etching. Selective oxidation can also be used since SiGe oxidizes at much higher rates than Si, especially under wet oxidation conditions. FIG. 13C shows the gate oxidation 1314 of the surface channel device as well as the supply layer implant 1316 for the buried channel device. Finally, FIG. 13D shows the position of the buried channel gate oxide 1318. No thinning of the top Si layer is required prior to the oxidation since the epitaxial thickness is optimized for the buried channel device. Subsequent to these initial steps, the processing for each device proceeds as previously described.

Another key step in the process is the use of a localized implant to create the supply layer needed in the buried channel device. In a MOSFET structure, when the channel is turned on, large vertical fields are present that bring carriers to the surface. The band offset between the Si and SiGe that confines the electrons in the buried strained Si layer is not large enough to prevent carriers from being pulled out of the buried channel. Thus, at first, the buried channel MOSFET would appear useless. However, if enough charge were present in the top SiGe layer, the MOSFET would become a depletion-mode device, i.e. normally on and requiring bias to turn off the channel. In the surface/buried channel device platform, a supply layer implant can be created in the regions where the buried channel will be fabricated, thus easing process integration. If for some reason the supply layer implant is not possible, note that the process shown in FIG. 11 in which the surface channel is created on the buried Si layer is an acceptable process, since the dopant can be introduced into the top SiGe layer during epitaxial growth. The supply layer is then removed from the surface channel MOSFET areas when the top SiGe and strained Si layers are selectively etched away.

In the processes described in FIGS. 10, 12 and 13, it is assumed that the desire is to fabricate a buried channel MOSFET. If the oxide of the buried channel device is removed, one can form a buried channel device with a metal gate (termed a MODFET or HEMT). The advantage of this device is that the transconductance can be much higher since there is a decrease in capacitance due to the missing oxide. However, there are two disadvantages to using this device. First, all thermal processes after gate definition have to be extremely low temperature, otherwise the metal will react with the semiconductor, forming an alloyed gate with a very low, or non-existent, barrier. Related to this issue is the second disadvantage. Due to the low thermal budget, the source and drain formation and contacts are typically done before the gate definition. Inverting these steps prevents the gate from being self-aligned to the source and drain, thus increasing the series resistance between the gate and the source and drain. Therefore, with a carefully designed buried channel MOSFET, the self-aligned nature can be a great advantage in device performance. Another benefit of the MOSFET structure is that the gate leakage is very low.

Figure 14A:
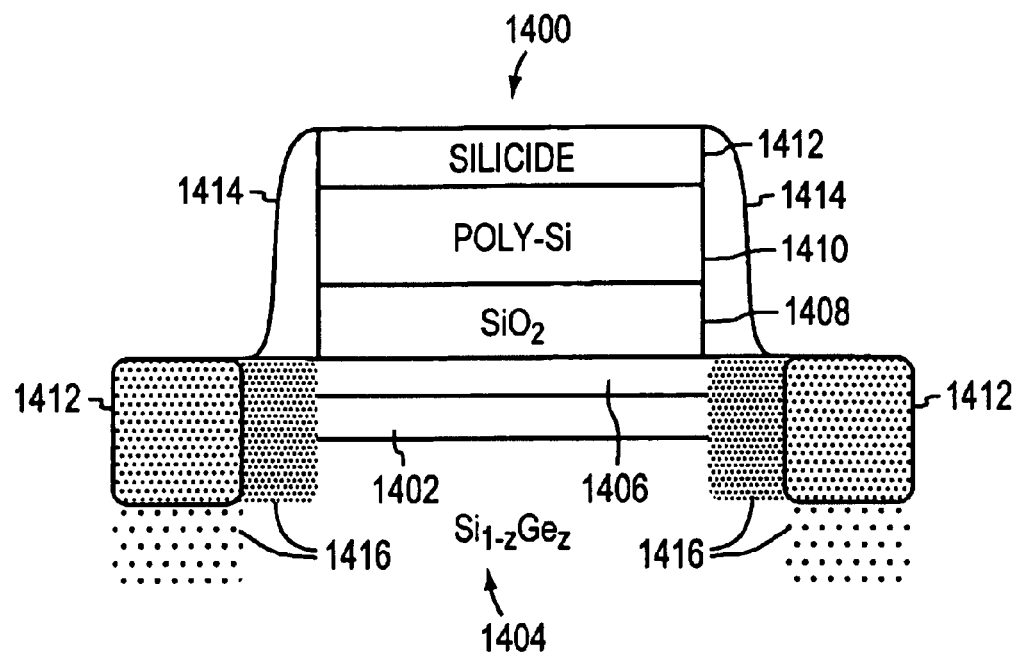
FIGS. 14A and 14B are schematic diagrams of surface and buried channel devices with $Si_{1-y}Ge_y$ channels on a relaxed $Si_{1-z}Ge_z$ layer.
Figure 14B:
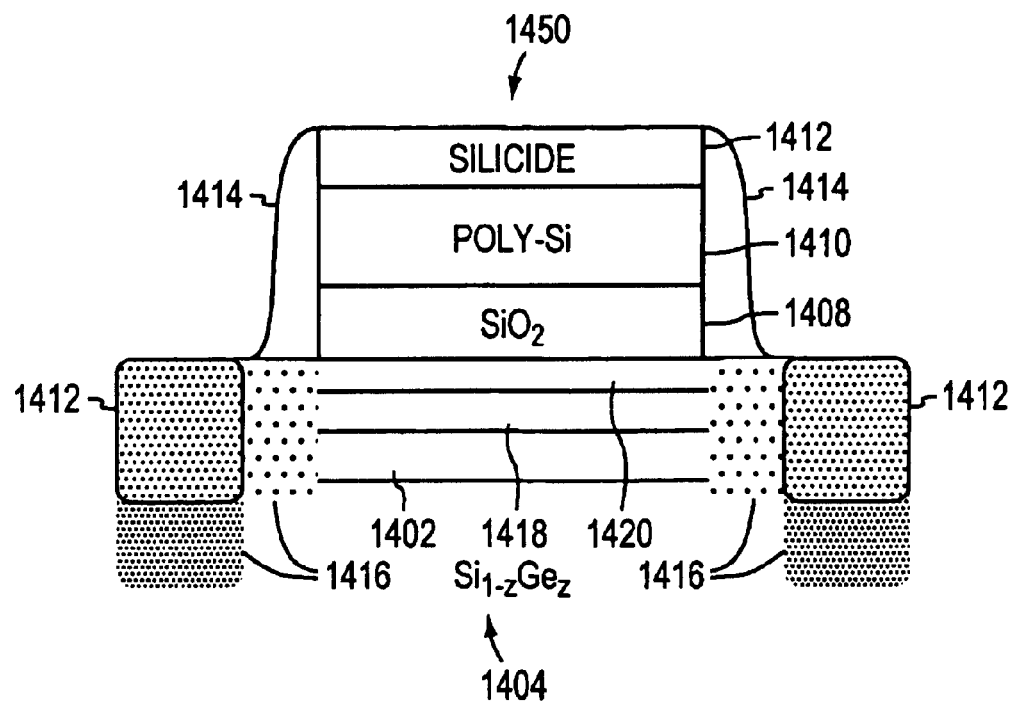

The combination of buried n-channel structures with n and p type surface channel MOSFETs has been emphasized heretofore. It is important to also emphasize that in buried n-channel devices as well as in surface channel devices, the channels need not be pure Si. $Si_{1-y}Ge_y$ channels can be used to increase the stability during processing. FIGS. 14A and 14B are schematic diagrams of surface 1400 and buried 1450 channel devices with $Si_{1-y}Ge_y$ channels 1402 on a relaxed $Si_{1-z}Ge_z$ layer 1404. The devices are shown after salicidation and thus contain a poly-Si gate 1410, gate oxide 1408, silicide regions 1412, spacers 1414, and doped regions 1416. In the surface channel device 1400, a thin layer 1406 of Si must be deposited onto the $Si_{1-y}Ge_y$ layer 1402 to form the gate oxide 1408, as previously described for buried channel devices. In the buried $Si_{1-y}Ge_y$ channel device 1450, the device layer sequence is unchanged and consists of a buried strained channel 1402, a SiGe spacer layer 1418, and a surface Si layer 1420 for oxidation.

To maintain tensile strain in the channel of an nMOS device, the lattice constant of the channel layer must be less than that of the relaxed SiGe layer, i.e., y must be less than z. Since n-channel devices are sensitive to alloy scattering, the highest mobilities result when the Ge concentration in the channel is low. In order to have strain on this channel layer at a reasonable critical thickness, the underlying SiGe should have a Ge concentration in the range of 10–50%.

Experimental data indicates that p channels are less sensitive to alloy scattering. Thus, surface MOSFETs with alloy channels are also possible. In addition, the buried channel devices can be p-channel devices simply by having the Ge concentration in the channel, y, greater than the Ge concentration in the relaxed SiGe alloy, z, and by switching the supply dopant from n-type to p-type. This configuration can be used to form Ge channel devices when y=1 and $0.5<z<0.9$.

With the ability to mix enhancement mode surface channel devices (n and p channel, through implants as in typical Si CMOS technology) and depletion-mode buried channel MOSFETs and MODFETs, it is possible to create highly integrated digital/analog systems. The enhancement mode devices can be fabricated into high performance CMOS, and the regions of an analog circuit requiring the high performance low-noise depletion mode device can be fabricated in the buried channel regions. Thus, it is possible to construct optimal communication stages, digital processing stages, etc. on a single platform. These different regions are connected electrically in the backend of the Si CMOS chip, just as transistors are connected by the back-end technology today. Thus, the only changes to the CMOS process are some parameters in the processes in the fabrication facility, and the new material, but otherwise, the entire manufacturing process is transparent to the change. Thus, the economics favor such a platform for integrated Si CMOS systems on chip.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a semiconductor structure, the method comprising the steps of:
   providing a first strained layer on a substrate;
   providing a spacer layer thereover;
   providing a surface strained layer over the spacer layer;
   forming at least one surface-channel device on the structure, the at least one surface-channel device having a carrier channel in the surface strained layer but not in the first strained layer; and
   forming at least one buried-channel device on the structure, the at least one buried-channel device having a carrier channel in the first strained layer but not in the surface strained layer.

2. The method of claim 1, wherein the at least one surface-channel device is a MOSFET comprising a gate dielectric over the strained surface layer.

3. The method of claim 1, wherein wherein the at least one buried-channel device is a FET comprising a thinned portion of the surface strained layer and a gate dielectric thereover.

4. The method of claim 1, further comprising the step of providing a dopant supply layer above and adjacent the first strained layer.

5. The method of claim 1, further comprising the step of providing a dopant supply layer below and adjacent the first strained layer.

6. The method of claim 1, wherein the spacer layer is a relaxed composition of silicon and germanium.

7. The method of claim 1, wherein at least one of the strained layers is silicon.

8. The method of claim 1, wherein both of the strained layers are silicon.

9. The method of claim 1, wherein at least the surface strained layer comprises Ge.

10. The method of claim 1, wherein at least the first strained layer comprises Ge.

11. The method of claim 1, wherein the first strained layer is compressively strained.

12. The method of claim 1, wherein the first strained layer is tensilely strained.

13. The method of claim 1, wherein the at least one buried-channel device is a FET comprising a gate dielectric disposed directly on the spacer layer.

14. A method of fabricating a semiconductor structure, the method comprising the steps of:
   providing a first strained layer on a substrate;
   providing a spacer layer thereover; and
   providing surface strained layer over the spacer layer, wherein the substrate comprises at least one planarized surface having an average roughness level no greater than 2 nm.

15. A method of fabricating a semiconductor structure, the method comprising the steps of:
   providing a first strained layer on a substrate;
   providing a spacer layer thereover; and
   providing surface strained layer over the spacer layer, wherein the substrate is fabricated according to steps comprising:
   providing a relaxed SiGe layer;
   planarizing the relaxed SiGe layer; and
   providing at least one regrown layer on the relaxed SiGe layer following planarization.

16. A method of fabricating a semiconductor structure, the method comprising the steps of:
   providing a first strained semiconductor layer on a substrate;
   providing a spacer layer thereover;
   providing surface strained layer over the spacer layer; and
   providing an insulator between the substrate and the first strained semiconductor layer.

17. The method of claim 16, wherein the insulator is $SiO_2$.

18. A method of fabricating a semiconductor structure, the method comprising the steps of:
   providing a first strained semiconductor layer on a substrate;
   providing a spacer layer thereover;
   providing surface strained layer over the spacer layer; and
   removing the surface strained layer and the spacer layer to form a carrier channel of a surface-channel device in the first strained semiconductor layer.

19. The method of claim 18, wherein the surface-channel device is a MOSFET comprising a gate dielectric over the first strained layer.

* * * * *